(12) United States Patent
Lu (10) Patent No.: US 12,237,274 B2
(45) Date of Patent: Feb. 25, 2025

(54) SEMICONDUCTOR STRUCTURES COMPRISING A VIA STRUCTURE WITH A FIRST PROTECTION STRUCTURE AND A SECOND PROTECTION STRUCTURE

(71) Applicant: CHANGXIN MEMORY TECHNOLOGIES, INC., Anhui (CN)

(72) Inventor: Zongzheng Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/693,819

(22) Filed: Mar. 14, 2022

(65) Prior Publication Data
US 2023/0028636 A1    Jan. 26, 2023

Related U.S. Application Data

(63) Continuation of application No. PCT/CN2021/117281, filed on Sep. 8, 2021.

(30) Foreign Application Priority Data

Jul. 20, 2021    (CN) .......................... 202110821475.7

(51) Int. Cl.
*H01L 23/552*    (2006.01)
*H01L 23/00*    (2006.01)
(Continued)

(52) U.S. Cl.
CPC ........ *H01L 23/552* (2013.01); *H01L 23/5226* (2013.01); *H01L 23/5283* (2013.01);
(Continued)

(58) Field of Classification Search
CPC ............... H01L 23/552; H01L 23/5226; H01L 23/5283; H01L 23/5286; H01L 24/05; H01L 2224/0557; H01L 2924/3025
See application file for complete search history.

(56) References Cited

U.S. PATENT DOCUMENTS 8,153,906 B2    4/2012    Hsu
RE44,586 E    11/2013    Hsu
(Continued)

FOREIGN PATENT DOCUMENTS

CN    101154644 A    4/2008
CN    101346039 A    1/2009
(Continued)

*Primary Examiner* — Thanh Y. Tran
(74) *Attorney, Agent, or Firm* — Kilpatrick Townsend & Stockton LLP (57) ABSTRACT

A semiconductor structure includes: at least one ground layer and at least one power supply layer arranged in a preset direction, and a via structure extending in the preset direction; and a first protection structure and a second protection structure that are sequentially disposed around a sidewall of the via structure in a direction surrounding the sidewall of the via structure and are spaced apart from each other, where a first spacing is formed between the first protection structure and the via structure, at least partial region of the first protection structure is electrically connected with the at least one ground layer, a second spacing is formed between at least partial region of the second protection structure and the via structure, and the second protection structure is electrically connected with the at least one power supply layer.

20 Claims, 4 Drawing Sheets

(51) Int. Cl.
*H01L 23/522* (2006.01)
*H01L 23/528* (2006.01)
(52) U.S. Cl.
CPC .......... *H01L 23/5286* (2013.01); *H01L 24/05* (2013.01); *H01L 2224/0557* (2013.01); *H01L 2924/3025* (2013.01)

(56) References Cited

U.S. PATENT DOCUMENTS

| | | |
|---|---|---|
| 2006/0237227 A1 | 10/2006 | Zhao |
| 2007/0007031 A1 | 1/2007 | Zhao |
| 2007/0144770 A1* | 6/2007 | Nakao ................. H05K 1/0225 174/260 |
| 2008/0073796 A1 | 3/2008 | Harvey |
| 2008/0169125 A1 | 7/2008 | Hsu |
| 2008/0272862 A1 | 11/2008 | Harvey |
| 2008/0314631 A1 | 12/2008 | Hsu |
| 2009/0045889 A1* | 2/2009 | Goergen .............. H05K 1/0216 174/266 |
| 2009/0180225 A1* | 7/2009 | Pan ...................... H05K 1/0259 361/56 |
| 2010/0132191 A1 | 6/2010 | Zhao |
| 2011/0005814 A1 | 1/2011 | Liu |
| 2011/0277323 A1 | 11/2011 | Zhao |
| 2013/0340250 A1 | 12/2013 | Zhao et al. |
| 2015/0250060 A1 | 9/2015 | Zhao |

FOREIGN PATENT DOCUMENTS

| | | |
|---|---|---|
| CN | 101945537 A | 1/2011 |
| CN | 103096613 A | 5/2013 |
| CN | 107734833 A | 2/2018 |
| CN | 107969065 B | 12/2020 |

\* cited by examiner

SEMICONDUCTOR STRUCTURES COMPRISING A VIA STRUCTURE WITH A FIRST PROTECTION STRUCTURE AND A SECOND PROTECTION STUCTURE

CROSS-REFERENCE TO RELATED APPLICATIONS

This application is a continuation application of International Patent Application No. PCT/CN2021/117281, filed on Sep. 8, 2021, which claims priority to Chinese Patent Application No. 202110821475.7, filed on Jul. 20, 2021 and entitled "SEMICONDUCTOR STRUCTURE". The contents of International Patent Application No. PCT/CN2021/117281 and Chinese Patent Application No. 202110821475.7 are hereby incorporated by reference in their entireties.

TECHNICAL FIELD

The embodiments of the present disclosure relate to, but are not limited to, a semiconductor structure.

BACKGROUND

With the high integration of a semiconductor structure, the semiconductor structure usually has a circuit structure with complex multilayer, and an electrical signal often needs to pass across layers through a via structure. With the increase of signal frequency and bandwidth, the via structure, as the connection structure between the conductive wires of different layers, will cause discontinuous impedance of the electrical, resulting in serious reflection problems, and will increase the crosstalk between adjacent electrical signals, resulting in some timing problems, thus adversely affecting the transmission quality of the electrical signal transmitted by the via structure.

SUMMARY

The embodiments of the present disclosure provide a semiconductor structure. The semiconductor structure include: at least one ground layer and at least one power supply layer arranged in a preset direction, and a via structure extending in the preset direction; and a first protection structure and a second protection structure. The first protection structure and the second protection structure are sequentially disposed around a sidewall of the via structure in a direction surrounding the sidewall of the via structure, and are spaced apart from each other. A first spacing is formed between the first protection structure and the via structure, at least partial region of the first protection structure is electrically connected with the at least one ground layer, a second spacing is formed between at least partial region of the second protection structure and the via structure, and the second protection structure is electrically connected with the at least one power supply layer.

BRIEF DESCRIPTION OF THE DRAWINGS

One or more embodiments are exemplified by the pictures in the accompanying drawings, which do not constitute a limitation on the embodiments, unless specifically stated, the figures in the drawings do not constitute scale limitations.

DETAILED DESCRIPTION

It is known from the background that the transmission quality of the electrical signal transmitted by the via structure at present needs to be improved.

It is found that the electrical signals are usually returned by using the ground layer or the power supply layer as the reference plane. The electrical signals transmitted by different via structures may be different from each other. The electrical signals are divided into high frequency signals and low frequency signals. Since there is no current passing through the ground layer except the loop current, additional electromagnetic interference caused by the ground layer to the high frequency signals and the low frequency signals can be avoided. For the high frequency signals with higher frequency, if the power supply layer is selected as the reference plane, there is noise in the power supply layer due to the large current passing through the power supply layer in addition to the loop current, which will cause very large electromagnetic interference to the high frequency signals with higher frequency and affect the transmission quality of the high frequency signals. For low frequency signals, if the power supply layer is selected as the reference plane, the electromagnetic interference caused by the power supply layer to the low frequency signals is generally within the acceptable range. Therefore, whether the high frequency signals or the low frequency signals, it is preferable to select the ground layer as the reference plane to realize the return.

However, since the variety of electrical devices exists in a semiconductor structure, more via structures are required to implement electrical connection between different devices. In order to satisfy the requirement that different via structures implement the return by means of a ground layer, the circuit in the semiconductor structure is complex and the number of stacked layers of the semiconductor structure is increased, and the manufacturing cost of the semiconductor structure is increased. Therefore, in general, high frequency signals are returned by using the ground layer as a reference plane, and low frequency signals are returned by using the power supply layer as a reference plane.

Even so, both parasitic capacitance and parasitic inductance exist when the via structure transmits electrical signals. In the design of high-speed digital circuit, the parasitic inductance and parasitic capacitance of the via will bring harm to the transmission of the electrical signal. The parasitic inductance of the via structure will weaken the contribution of the bypass capacitance in the semiconductor structure, weaken the filtering effect of the whole semiconductor structure, and increase the voltage drop of the electrical signal flowing through the via structure. The increase of the voltage drop will cause transmission line effect, such as abrupt change, crosstalk, switching noise, track collapse and ground bounce. The main influence of parasitic capacitance of via structure on the transmission of electrical signal is to prolong the rise time of the electrical signal and reduce the transmission speed of the electrical signal.

Therefore, it is urgent to design a new semiconductor structure in order to reduce the complexity of the circuit in the semiconductor structure and improve the transmission quality of the electrical signal transmitted by the via structure.

The embodiments of the present disclosure provides a semiconductor structure in which a majority of a sidewall of a via structure is surrounded by a first protection structure and a second protection structure together, at least partial region of the first protection structure is electrically connected with a ground layer, and at least partial region of the second protection structure is electrically connected with a power supply layer. Therefore, for a via structure that transmits electrical signals with different frequencies, a shorter return path can be provided for the via structure by the first protection structure or the second protection structure. Therefore, a solution in which the first protection structure and the second protection structure jointly wrap the via structure is applicable to both the via structure for transmitting high frequency signals and the via structure for transmitting low frequency signals, which is conducive to simplifying the circuit layout in the semiconductor structure. This is beneficial to reduce the preparation cost of the semiconductor structure and shorten the return path, and is beneficial to improve the transmission quality of the electrical signals transmitted by the via structure compared with the solution that all the via structures realize the return through the ground layer. Furthermore, the first protection structure and the second protection structure may serve as a protection shell for the via structure for isolating the via structure from the electrical devices around the via structure together, so as to reduce the influence of electromagnetic interference between the adjacent via structures and between the via structure and other electrical devices around the via structure.

Various embodiments of the present disclosure will be described in detail below with reference to the accompanying drawings. However, those of ordinary skill in the art will appreciate that many technical details have been proposed in various embodiments of the present disclosure for the better understanding of the present disclosure. However, the technical solutions claimed in the present disclosure can be realized even without these technical details and various changes and modifications according to the following embodiments.

Figure 1:
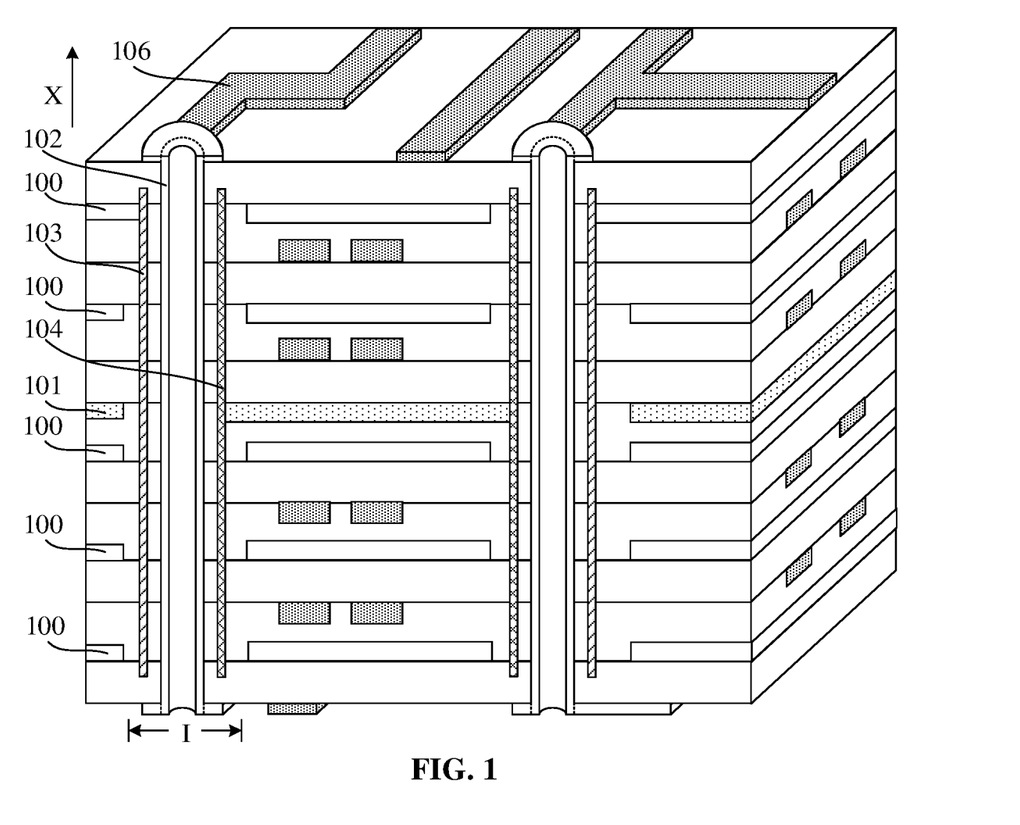
FIG. 1 illustrates a three-dimensional schematic diagram of a semiconductor structure according to an embodiment of the present disclosure.
Figure 2:
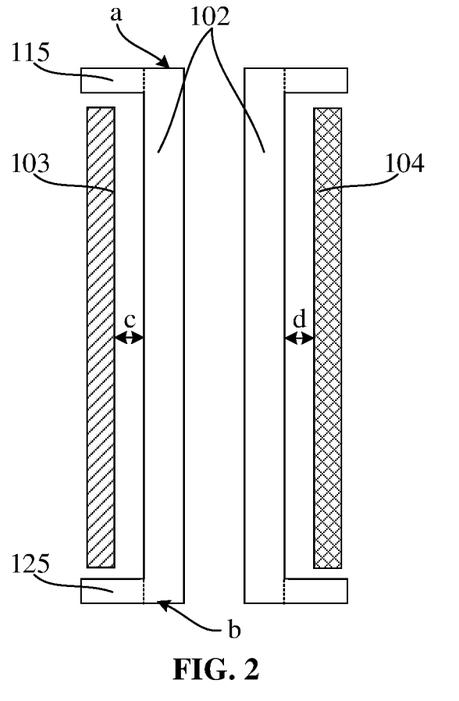
FIG. 2 illustrates a schematic cross-sectional diagram of a via structure, a first protection structure, a second protection structure, a first bonding pad and a second bonding pad in a semiconductor structure.
Figure 3:
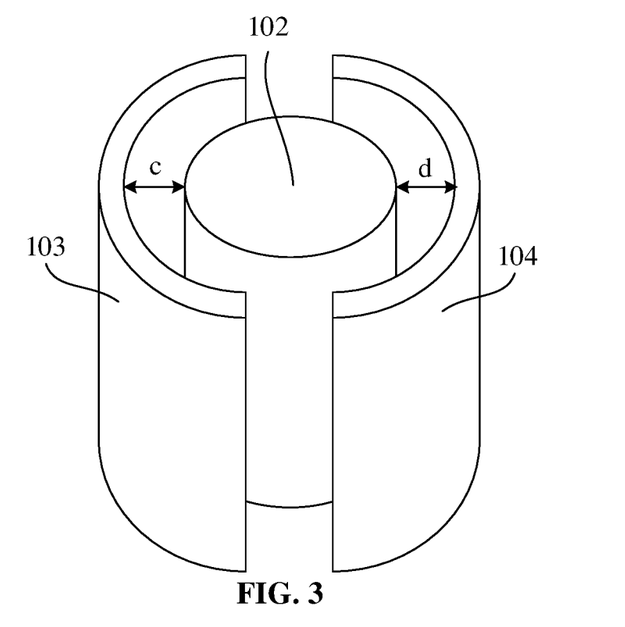
FIG. 3 to FIG. 5 illustrate three-dimensional schematic diagrams of a via structure, a first protection structure, and a second protection structure in a semiconductor structure.
Figure 4:
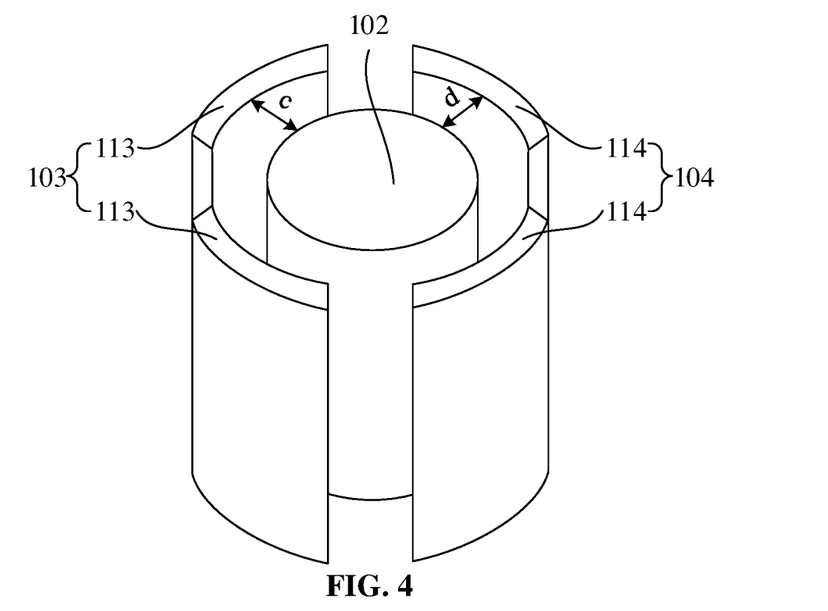
Figure 5:
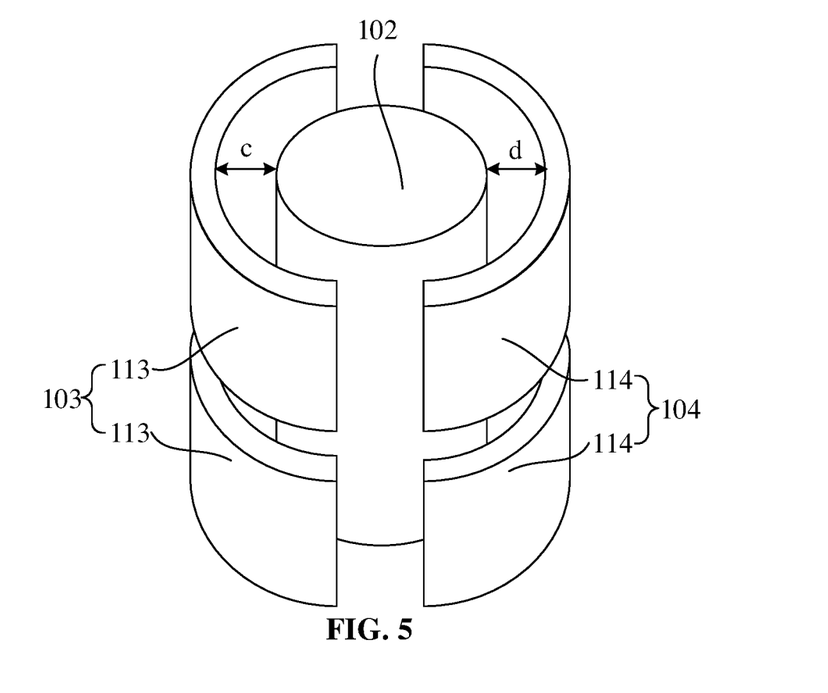
Figure 6:
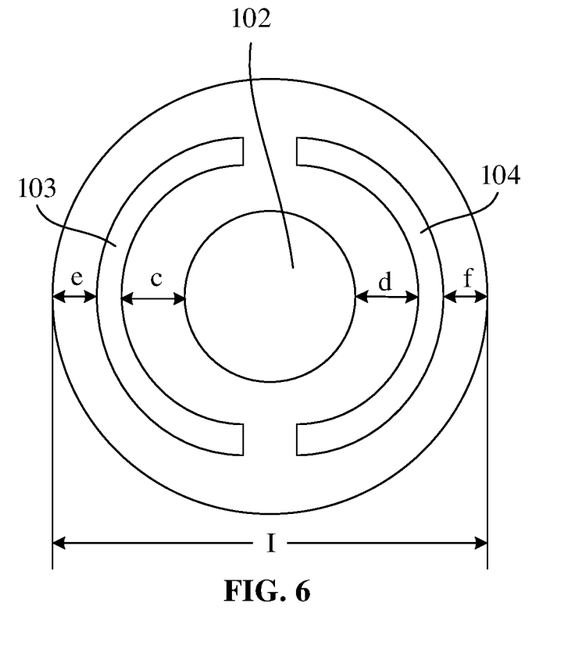
FIG. 6 illustrates a schematic top view of a via structure, a first protection structure, a second protection structure, and an anti-bonding pad region in a semiconductor structure.

The embodiments of the present disclosure provide a semiconductor structure, which will be described in detail below with reference to the accompanying drawings. FIG. 1 illustrates a three-dimensional schematic diagram of a semiconductor structure according to an embodiment of the present disclosure. FIG. 2 illustrates a schematic cross-sectional diagram of a via structure, a first protection structure, a second protection structure, a first bonding pad and a second bonding pad in a semiconductor structure. FIG. 3 to FIG. 5 illustrate three-dimensional schematic diagrams of a via structure, a first protection structure, and a second protection structure in a semiconductor structure. FIG. 6 illustrates a schematic top diagram of a via structure, a first protection structure, a second protection structure, and an anti-bonding pad region in the semiconductor structure.

Referring to FIG. 1 and FIG. 2, the semiconductor structure includes: at least one ground layer 100 and at least one power supply layer 101 arranged in a preset direction X, and a via structure 102 extending in the preset direction X; and a first protection structure 103 and a second protection structure 104. The first protection structure 103 and the second protection structure 104 are sequentially disposed around a sidewall of the via structure 102 in a direction surrounding the sidewall of the via structure 102. The first protection structure 103 and the second protection structure 104 are spaced apart from each other. A first spacing c is formed between the first protection structure 103 and the via structure 102, and at least partial region of the first protection structure 103 is electrically connected to the at least one ground layer 100. A second spacing d is formed between at least partial region of the second protection structure 104 and the via structure 102, and the second protection structure 104 is electrically connected to the at least one power supply layer 101.

When an electrical signal flows through the via structure 102, a voltage drop is generated at both ends of the via structure 102, The voltage drop is associated with the self-inductance generated by the via structure 102 itself, the mutual inductance generated by the via structure 102 and the electrical devices around the via structure 102, and the change rate of the current when the electrical signal flows through the via structure 102. Specifically, the voltage drop may be expressed by the following formula:

$$V_{gb} = (L_a - L_{ab})\frac{dI}{dt}$$

$V_{gb}$ is the voltage drop generated by the electrical signal at both ends of the via structure 102, $L_a$ is the self-inductance generated by the via structure 102 itself, $L_{ab}$ is the mutual inductance generated between the via structure 102 and the electrical devices around the via structure 102, and dI/dt is the change rate of the current when the electrical signal flows through the via structure 102.

It should be noted that in the embodiments of the present disclosure, the electrical signal transmitted by the via structure 102 is returned by using the first protection structure 103 as the reference plane, and in the practical application, the electrical signal transmitted by the via structure 102 can also be returned by using the second protection structure 104 as the reference plane. For the same via structure 102, the change rate of the electric current when the electric signal flows through the via structure 102 is a fixed value, the sidewall of the via structure 102 is surrounded by the first protection structure 103, $L_{ab}$ is a mutual inductance generated between the via structure 102 and the first protection structure 103, and the first protection structure 103 is relatively close to the sidewall of the via structure 102, which is conducive to increasing the mutual inductance generated between the via structure 102 and the first protection structure 103. Compared with the way in which the via structure 102 realizes return by means of the ground layer 100 which is farther away from the via structure 102, the embodiments of the present disclosure facilitate providing a shorter return path for the via structure 102 by the first protection structure 103, and reducing the voltage drop $V_{gb}$ generated by the electric signal at both ends of the via structure 102 by increasing the mutual inductance $L_{ab}$ generated between the via structure 102 and the first protection structure 103, so as to avoid the transmission line effect caused by the larger voltage drop, thereby improving the transmission quality of the electrical signal transmitted by the via structure 102.

In addition, on the one hand, each of the different via structures 102 can realize return by means of the first protection structure 103 closest to the via structure 102, avoid the cross-division of the return path of the electrical signal in the via structure 102, and reduce the surrounding region of the electrical signal when the electrical signal is returned, thereby reducing the radiation energy generated when the electrical signal is returned, and reducing the electromagnetic interference to various electrical devices in the semiconductor structure when the electrical signal is returned. On the other hand, the first protection structure 103 and the second protection structure 104 may serve as a protection shell for the sidewall of the via structure 102 to isolate the via structure 102 from the electrical devices around the via structure 102, thereby reducing electromagnetic interference between the adjacent via structures 102 and between the via structure 102 and other electrical devices around the via structure 102. Both of the above facilitate improving the transmission quality of the electrical signal transmitted by the via structure 102 by reducing electromagnetic interference between the via structure 102 and the electrical devices around the via structure 102.

It should be noted that the semiconductor structure in FIG. 1 is provided with five layers of the ground layer 100 and one layer of the power supply layer 101 as an example. In other embodiments, the number of layers of the ground layer 100 and the number of layers of the power supply layer 101 may be reasonably set according to actual electrical requirements. Furthermore, the various electrical devices and conductive structures in FIG. 1 are isolated from each other by a dielectric layer.

In some embodiments, referring to FIG. 1 or 2, the via structure 102 is provided with a top end a and a bottom end b in the preset direction X, and the top end a and the bottom end b are opposite to each other. The semiconductor structure may further include a first bonding pad 115 that is in contact with the top end a and is electrically connected with the top end a, and a second bonding pad 125 that is in contact with the bottom end b and is electrically connected with the bottom end b. Both the first protection structure 103 and the second protection structure 104 are located between the first bonding pad 115 and the second bonding pad 125. Each of the first protection structure 103 and the second protection structure 104 is spaced apart from the first bonding pad 115, and each of the first protection structure 103 and the second protection structure 104 is spaced apart from the second bonding pad 125.

Therefore, in the preset direction X, both the length of the first protection structure 103 and the length of the second protection structure 104 are smaller than the length of the via structure 102. For example, in the preset direction X, the length of the via structure 102 minus the length of the first bonding pad 115 and the length of the second bonding pad 125 is the reference length, and both the length of the first protection structure 103 and the length of the second protection structure 104 are smaller than the reference length, so as to ensure that neither the first protection structure 103 nor the second protection structure 104 is in contact with the first bonding pad 115, and neither the first protection structure 103 nor the second protection structure 104 is in contact with the second bonding pad 125. In addition, under the premise that a length (that is, an arc length) of the first protection structure 103 surrounding the sidewall of the via structure 102 and a length (that is, an arc length) of the second protection structure 104 surrounding the sidewall of the via structure 102 are fixed value in the direction surrounding the sidewall of the via structure 102, the length of the first protection structure 103 and the length of the second protection structure 104 are close to the reference length, which helps to ensure that the first protection structure 103 and the second protection structure 104 have a larger wrapping area for wrapping the sidewall of the via structure 102, thereby increasing the protection effect of the first protection structure 103 and the second protection structure 104 on the via structure 102. Specifically, the first protection structure 103 has a large wrapping area for wrapping the sidewall of the via structure 102, which helps to ensure that there is a large mutual inductance between the via structure 102 and the first protection structure 103, so as to reduce the voltage drop of the electrical signal generated at both ends of the via structure 102, thereby avoiding the transmission line effect caused by the large voltage drop, and improving the transmission quality of the electrical signal transmitted by the via structure 102. Both the first protection structure 103 and the second protection structure 104 have a large wrapping area for wrapping the sidewall of the via structure 102, which helps to improve the isolation effect between the via structure 102 and the electrical devices around the via structure 102, thereby reducing electromagnetic interference between the adjacent via structures 102 and between the via structure 102 and other electrical devices around the via structure 102.

The semiconductor structure may further include a first wire layer 106 that is in contact with the first bonding pad 115 and is electrically connected with the first bonding pad 115, and a second wire layer (not shown in FIG. 1) that is in contact with the second bonding pad 125 and is electrically connected with the second bonding pad 125. The first wire layer 106 and the second wire layer together are configured to transmit electrical signals in the via structure 102 to other electrical devices.

The plane where the bottom end b is located is the projection plane, and a combination of an orthographic projection of the first protection structure 103 on the projection plane and an orthographic projection of the second protection structure 104 on the projection plane is located in an orthographic projection of the first bonding pad 115 on the projection plane and is located in an orthographic projection of the second bonding pad 125 on the projection plane. In this way, when the via structure 102 is provided with the first bonding pad 115 and the second bonding pad 125, the first protection structure 103 and the second protection structure 104 do not occupy too much layout space in the direction perpendicular to the preset direction X, which facilitates reducing the layout range of the semiconductor structure in the direction perpendicular to the preset direction X, thereby increasing the integrated density of the semiconductor structure. Moreover, compared to the way in which the ground hole is additionally added to optimize the return path of the electrical signal in the via structure 102, the embodiments of the present disclosure facilitate eliminating the space occupied by the ground hole in the semiconductor structure and reducing the complexity of the circuit connection in the semiconductor structure.

In other embodiments, the via structure is provided with a top end and a bottom end in the preset direction, and the top end and the bottom end are opposite to each other. The semiconductor structure may further include a first wire layer that is in contact with the top end and is electrically connected with the top end, and a second wire layer that is in contact with the bottom end and is electrically connected with the bottom end. The first wire layer passes through a spacing between the first protection structure and the second protection structure, and the second wire layer passes through a spacing between the first protection structure and the second protection structure. The first wire layer and the second wire layer together are configured to transmit electrical signals in the via structure to other electrical devices.

Furthermore, since the semiconductor structure is not provided with a first bonding pad in contact with the top end and a second bonding pad in contact with the bottom end, the length of the first protection structure and the length of the second protection structure in the preset direction may be not only smaller than the length of the via structure, but also larger than or equal to the length of the via structure. For example, both the length of the first protection structure and the length of the second protection structure may be equal to the length of the via structure. On the one hand, on the premise that the length (that is, the arc length) of the first protection structure surrounding the sidewall of the via structure and the length (that is, the arc length) of the second protection structure surrounding the sidewall of the via structure are fixed value in the direction surrounding the sidewall of the via structure, it is beneficial to increase the wrapping area of the first protection structure and the second protection structure for wrapping the sidewall of the via structure, and the specific advantages of a larger wrapping area of the first protection structure and the second protection structure for wrapping the sidewall of the via structure are the same as the advantages of the above embodiments, which will not be repeated here. On the other hand, it is beneficial to ensure the smaller volume of the first protection structure and the second protection structure while increasing the wrapping area of the first protection structure and the second protection structure for wrapping the sidewall of the via structure, which facilitates reducing the layout space of the first protection structure and the second protection structure in the semiconductor structure and reducing the preparation cost of the first protection structure and the second protection structure.

In some embodiments, regardless of whether the semiconductor structure is provided with the first bonding pad 115 and the second bonding pad 125, the ratio of the length of the first protection structure 103 to the length of the via structure 102 in the preset direction X is not less than ¾, and the ratio of the length of the second protection structure 104 to the length of the via structure 102 is not less than ¾, so as to ensure that both the first protection structure 103 and the second protection structure 104 have a larger wrapping area for wrapping the sidewall of the via structure 102, which ensures a good protection effect of the first protection structure 103 and the second protection structure 104 on the via structure 102, thereby ensuring a good transmission quality of the electrical signal transmitted by the via structure 102.

It should be noted that the via structure 102 is a hollow cylindrical structure as shown in FIG. 1 as an example, that is, the cross-sectional shape of the via structure 102 is a circular ring in a plane where the bottom end b is located. In practical application, the cross-sectional shape of the via structure may be a square ring, a circle, a rectangle, or the like in the plane where the bottom end is located, and the cross-sectional shape of the via structure is not limited in the embodiments of the present disclosure. In addition, in the embodiments of the present disclosure, for example, both the first protection structure 103 and the second protection structure 104 surrounding the via structure 102 are arc-shaped structures, that is, each of the cross-sectional shape of the first protection structure 103 and the cross-sectional shape of the second protection structure 104 is an annular section in the plane where the bottom end b is located. In practical application, the first protection structure and the second protection structure may be provided as other types of structures according to actual circuit requirements, and the cross-sectional shapes of the first protection structure and the second protection structure are not limited in the embodiments of the present disclosure.

In some embodiments, the via structure 102 is a hollow cylindrical structure, which is beneficial to adjust the difference between the resistance of the via structure 102 and the resistance of the first wire layer 106 electrically connected with the via structure 102 and the difference between the resistance of the via structure 102 and the resistance of the second wire layer electrically connected with the via structure 102, so that the resistance of the via structure 102, the resistance of the first wire layer 106, and the resistance of the second wire layer are close to or equal to each other, which is beneficial to reduce the impedance discontinuity when the electrical signal is transmitted in the first wire layer 106, the via structure 102, and the second wire layer, so as to improve the transmission quality of the electrical signal in the first wire layer 106, the via structure 102, and the second wire layer.

In the above embodiments, in the direction surrounding the sidewall of the via structure 102, the ratio of the length (that is, the arc length) of the first protection structure 103 surrounding the sidewall of the via structure 102 to the circumference of the sidewall of the via structure 102 ranges from 0.4 to 0.6, and the ratio of the length (that is, the arc length) of the second protection structure 104 surrounding the sidewall of the via structure 102 to the circumference of the sidewall of the via structure 102 ranges from 0.4 to 0.6. When both the first protection structure 103 and the second protection structure 104 are arc-shaped structures, the angle (that is, the central angle) of the first protection structure 103 surrounding the via structure 102 ranges from 144 degrees to 216 degrees, and the angle (that is, the central angle) of the second protection structure 104 surrounding the via structure 102 ranges from 144 degrees to 216 degrees. In this way, on the premise that the length of the first protection structure and the length of the second protection structure are fixed value in the preset direction X, the angle (that is, the central angle) of the first protection structure 103 and the angle (that is, the central angle) of the second protection structure 104 surrounding the via structure 102 are within this range, which is conducive to ensuring a large wrapping area of the first protection structure 103 and the second protection structure 104 for wrapping the sidewall of the via structure 102, so as to ensure a good protection effect of the first protection structure 103 and the second protection structure 104 on the via structure 102, thereby ensuring a good transmission quality of the electric signal transmitted by the via structure 102.

For example, when the angle (that is, the central angle) of the first protection structure 103 surrounding the via structure 102 is less than 180 degrees, but close to 180 degrees, and the angle (that is, the central angle) of the second protection structure 104 surrounding the via structure 102 is less than 180 degrees, but close to 180 degrees, for the via structure 102 with the first protection structure 103 as the reference plane or with the second protection structure 104 as the reference plane, it is beneficial to improve the reduction degree of the voltage drop of the electric signal generated at both ends of the via structure 102 by ensuring a larger wrapping area of the first protection structure 103 or the second protection structure 104 for wrapping the sidewall of the via structure 102, thereby reducing the electromagnetic interference between the via structure 102 and the electrical devices around the via structure 102, and improving the transmission quality of the electrical signal transmitted by the via structure 102. Furthermore, it is beneficial to increase the total wrapping area of the first protection structure 103 and the second protection structure 104 for wrapping the sidewall of the via structure 102, so as to improve the isolation effect between the via structure 102 and the electrical devices around the via structure 102, thereby reducing electromagnetic interference between the adjacent via structures 102 and between the via structure 102 and other electrical devices around the via structure 102.

Referring to FIG. 3 to FIG. 5, FIG. 3 to FIG. 5 illustrate three-dimensional schematic diagrams of a via structure 102, a first protection structure 103, and a second protection structure 104 in a semiconductor structure. It should be noted that the via structure 102 is a solid cylindrical structure as an example in FIG. 3 to FIG. 5, and in practical application, the via structure 102 may also be a hollow cylindrical structure. Detailed descriptions of the via structure 102, the first protection structure 103, and the second protection structure 104 are as follows.

In some embodiments, referring to FIG. 3, each of the first protection structure 103 and the second protection structure 104 is a full-face film layer, and the reference plane of the electrical signal in the via structure 102 for return is a complete plane, which is conducive to avoiding cross-division of the return path of the electrical signal in the via structure 102 which causes interference to the electrical signal in the via structure 102, so as to improve the transmission quality of the electrical signal transmitted by the via structure 102.

In other embodiments, referring to FIG. 4, the first protection structure 103 includes at least two first sub-protection structures 113 spaced apart from each other in the direction surrounding the sidewall of the via structure 102, and at least one of the first sub-protection structures 113 is electrically connected with the ground layer 100 (referring to FIG. 1). The second protection structure 104 includes at least two second sub-protection structures 114 spaced apart from each other in the direction surrounding the sidewall of the via structure 102, and at least one of the second sub-protection structures 114 is electrically connected with the power supply layer 101 (referring to FIG. 1).

In still other embodiments, referring to FIG. 5, the first protection structure 103 includes at least two first sub-protection structures 113 spaced apart from each other in the preset direction X, and at least one of the first sub-protection structures 113 is electrically connected with the ground layer 100 (referring to FIG. 1). The second protection structure 104 includes at least two second sub-protection structures 114 spaced apart from each other in the preset direction X, and at least one of the second sub-protection structures 114 is electrically connected with the power supply layer 101 (referring to FIG. 1).

It should be noted that the first protection structure 103 includes two first sub-protection structures 113 spaced apart from each other and the second protection structure 104 includes two second sub-protection structures 114 spaced apart from each other are taken as examples in FIGS. 4 and 5. In practical application, the number of first sub-protection structures 113 of the first protection structure 103 and the number of second sub-protection structures 114 of the second protection structure 104 are not limited.

In the embodiments illustrated in FIGS. 4 and 5, at least the other one of the first sub-protection structures 113 may be electrically connected with the power supply layer 101. For example, when the electrical signal in the via structure 102 takes the power supply layer 101 as the reference plane, some of the first sub-protection structures 113 may be electrically connected with the power supply layer 101 while all the second sub-protection structures 114 may be electrically connected with the power supply layer 101, so as to facilitate further increasing the total mutual inductance between the via structure 102 and the first protection structure 103 as well as the second protection structure 104, so as to further reduce the voltage drop of the electrical signal generated at both ends of the via structure 102, so as to avoid the transmission line effect due to the larger voltage drop, thereby facilitating improving the transmission quality of the electrical signal transmitted by the via structure 102.

In the embodiments illustrated in FIGS. 4 and 5, at least the other one of the second sub-protection structures 114 may be electrically connected with the ground layer 100. For example, when the electrical signal in the via structure 102 takes the ground layer 100 as the reference plane, some of the second sub-protection structures 114 may be electrically connected with the ground layer 100 while all the first sub-protection structures 113 may be electrically connected with the ground layer 100, so as to facilitate further increasing the total mutual inductance between the via structure 102 and the first protection structure 103 as well as the second protection structure 104, so as to further reduce the voltage drop of the electrical signal generated at both ends of the via structure 102, so as to avoid the transmission line effect due to the larger voltage drop, thereby facilitating improving the transmission quality of the electrical signal transmitted by the via structure 102.

In the above embodiments, each of the thickness of the first protection structure 103 and the thickness of the second protection structure 104 in a direction perpendicular to the preset direction X ranges from 8 um to 25 um. When the thickness of the first protection structure 103 and the thickness of the second protection structure 104 are greater than 25 um, the first protection structure 103 and the second protection structure 104 are easily detached from the connected ground layer 100 or power supply layer 101, and when the thickness of the first protection structure 103 and the thickness of the second protection structure 104 are less than 8 um, it is difficult to control the process accuracy for preparing the first protection structure 103 and the second protection structure 104, which affects the electrical characteristics of the first protection structure 103 and the second protection structure 104. Therefore, it is appropriate that the thickness of the first protection structure 103 and the thickness of the second protection structure 104 are in the range of 8 um to 25 um. For example, the thickness of the first protection structure 103 and the thickness of the second protection structure 104 are 20 um, and such a thickness has a small effect on the electrical characteristics of the first protection structure 103 and the second protection structure 104. In other embodiments, the thickness of the first protection structure may not be equal to the thickness of the second protection structure.

The material of the first protection structure 103 is the same as the material of the ground layer 100, and the material of the second protection structure 104 is the same as the material of the power supply layer 101. In this way, it is beneficial to reduce the difference in electrical characteristics between the material of the first protection structure 103 and the material of the ground layer 100, and to reduce the impedance discontinuity of the electrical signal transmitted between the first protection structure 103 and the ground layer 100 when the electrical signal is returned with the ground layer 100 as the reference plane; and it is also beneficial to reduce the difference in electrical characteristics between the material of the second protection structure 104 and the material of the power supply layer 101, and to reduce the impedance discontinuity of the electrical signal transmitted between the second protection structure 104 and the power supply layer 101 when the electrical signal is returned with the power supply layer 101 as the reference plane.

Specifically, both the material of the first protection structure 103 and the material of the second protection structure 104 are one of conductive materials such as copper, silver, and platinum. For example, the material of the first protection structure 103 and the material of the second protection structure 104 are the same and are copper, which facilitates reducing the preparation cost for the first protection structure 103 and the second protection structure 104. Furthermore, under the premise that the material of the first protection structure 103 and the material of the second protection structure 104 are the same, the length of the first protection structure 103 and the length of the second protection structure 104 in the preset direction X may also be equal to each other, which is beneficial to form the first protection structure 103 and the second protection structure 104 through the same process, and to simplify the preparation processes for the first protection structure 103 and the second protection structure 104.

In the embodiments of the present disclosure, referring to FIG. 1 and FIG. 6, the semiconductor structure may further include an anti-bonding pad region I extending in the preset direction X, where the via structure 102, the first protection structure 103, and the second protection structure 104 are located within the anti-bonding pad region I. The via structure 102 is a hollow cylindrical structure as an example shown in FIG. 1 and FIG. 6, and the anti-bonding pad region I is a cylindrical region, that is, the cross-sectional shape of the anti-bonding pad region I is also a circular ring in the plane where the bottom end b is located. In some embodiments, the via structure 102 is disposed coaxially with the anti-bonding pad region I. The anti-bonding pad region I is configured to ensure a spacing between the via structure 102 and other electrical devices and conductive structures in the semiconductor structure, where a dielectric layer is arranged in the spacing to isolate the via structure 102 from other electrical devices and conductive structures in the semiconductor structure.

In the plane perpendicular to the preset direction X, the ratio of the cross-sectional area of the anti-bonding pad region I to the cross-sectional area of the via structure 102 ranges from 9 to 12.25. In some embodiments, when the via structure 102 is a hollow cylindrical structure and the anti-bonding pad region I is also a cylindrical region, the diameter of the outer wall of the via structure 102 may be 200 um, which can ensure a low material cost of the via structure 102 while ensuring good electrical characteristics of the via structure 102. The diameter of the outer periphery of the anti-bonding pad region I may range from 600 um to 700 um, and the anti-bonding pad region I with a size within this range is beneficial to ensure that there is an appropriate spacing between the via structure 102 and other electrical devices and conductive structures in the semiconductor structure, and to control the anti-bonding pad region I to occupy a small layout space in the semiconductor structure. Herein, the diameter of the periphery of the anti-bonding pad region I may be 650 um.

A third spacing e is formed between the first protection structure 103 and the anti-bonding pad region I in the direction perpendicular to the preset direction X, and a fourth spacing f is formed between the second protection structure 104 and the anti-bonding pad region I in the direction perpendicular to the preset direction X. The ratio of the width of the first spacing c to the width of the third spacing e ranges from 0.8 to 4.5, and the ratio of the width of the second spacing d to the width of the fourth spacing f ranges from 0.8 to 4.5.

In some embodiments, the width of the first spacing c and the width of the second spacing d may not be equal to each other. When the electrical signal is returned with the first protection structure 103 as the reference plane, the smaller the width of the first spacing c, the more conducive to the formation of a tight coupling between the first protection structure 103 and the via structure 102, which is beneficial to reduce the crosstalk influence of the via structure 102 on other via structures 102, effectively protect the via structure 102 from being interfered by other via structures 102, and reduce the noise of the via structure 102, and which further helps to reduce the return path of the electrical signal in the via structure 102, so as to reduce the voltage drop generated by the electrical signal flowing through the via structure 102 and ensure a more stable voltage at both ends of the via structure 102, thereby improving the transmission quality of the electrical signal transmitted by the via structure 102. At this time, the second spacing d can be served as a protective shell to isolate the via structure 102 from the electrical devices around the via structure 102, thereby reducing the electromagnetic interference between the adjacent via structure 102 and between the via structure 102 and other electrical devices around the via structure 102. In other embodiments, the width of the first spacing and the width of the second spacing may also be the same.

In other embodiments, when the electrical signal is returned with the second protection structure 104 as the reference plane, the smaller the width of the second spacing d, the more conducive to the semiconductor structure, and the beneficial effect to the semiconductor structure is the same as the beneficial effect of the above embodiments, which will not be repeated here.

However, in the above embodiments, when the width of the first spacing c and the width of the second spacing d are too small, the first protection structure 103 and the second protection structure 104 will be too close to the via structure 102, which will increase the manufacturing difficulty of the first protection structure 103 and the second protection structure 104, and both the first protection structure 103 and the second protection structure 104 are prone to be in contact with the via structure 102 to cause a short circuit problem. Therefore, the width of the first spacing c and the width of the second spacing d can be limited to be in the range of 10 um to 225 um, which is beneficial to reduce manufacturing difficulty of the first protection structure 103 and the second protection structure 104, and avoid the problem of short circuit caused by the contact between the first protection structure 103 and the via structure 102 as well as the contact between the second protection structure 104 and the via structure 102 while improving the transmission quality of the electrical signal transmitted by the via structure 102.

In a specific embodiment, the via structure 102 is a hollow cylindrical structure, the anti-bonding pad region I is a cylindrical region, the diameter of the outer wall of the via structure 102 is 200 um, the distance between the outer wall and the inner wall of the via structure 102 ranges from 13 um to 25 um, the diameter of the anti-bonding pad region I is 650 um, both the width of the first spacing c and the width of the second spacing d may range from 150 um to 225 um.

In another specific embodiment, the via structure 102 is a hollow cylindrical structure, the anti-bonding pad region I is a cylindrical region, the diameter of the outer wall of the via structure 102 is 200 um, the distance between the outer wall and the inner wall of the via structure 102 ranges from 13 um to 25 um, the diameter of the anti-bonding pad region I is 650 um, both the width of the third spacing e and the width of the fourth spacing f may range from 0 um to 125 um.

In summary, a majority of the sidewall of the via structure 102 can be surrounded by the first protection structure 103 and the second protection structure 104, and at least partial region of the first protection structure 103 is electrically connected with the ground layer 100, and at least partial region of the second protection structure 104 is electrically connected with the power supply layer 101. Therefore, for the via structure 102 that transmits electrical signals with different frequencies, the first protection structure 103 or the second protection structure 104 can provide a shorter return path for the via structure 102, the solution that the first protection structure 103 and the second protection structure 104 jointly wrap the via structure 102 is applicable to both the via structure 102 for transmitting high frequency signals and the via structure 102 for transmitting low frequency signals, which is conducive to simplifying circuit layout of the semiconductor structure. This is beneficial to reduce the manufacturing cost of the semiconductor structure and shorten the return path, and is beneficial to improve the transmission quality of the electrical signals transmitted by the via structure 102, compared with the solution that all the via structures 102 realize the return through the ground layer. In addition, the first protection structure 103 and the second protection structure 104 can together serve as a protection shell for the via structure 102 to isolate the via structure 102 from the electrical devices around the via structure 102, thereby reducing the electromagnetic interference between the adjacent via structures 102 and between the via structure 102 and other electrical devices around the via structures 102.

Those of ordinary skill in the art can understand that the above embodiments are specific examples for realizing the present disclosure, and in actual applications, various changes can be made in form and details without departing from the spirit and spirit of the present disclosure. Anyone skilled in the art, without departing from the spirit and scope of the present disclosure, can make their own changes and modifications. Therefore, the protection scope of the present disclosure shall be subject to the scope defined by the claims.

The invention claimed is:

1. A semiconductor structure, comprising:
at least one ground layer and at least one power supply layer arranged in a preset direction, and a via structure extending in the preset direction; and
a first protection structure and a second protection structure, wherein the first protection structure and the second protection structure are sequentially disposed around a sidewall of the via structure in a direction surrounding the sidewall of the via structure, and are spaced apart from each other, wherein a first spacing is formed between the first protection structure and the via structure, at least partial region of the first protection structure is electrically connected with the at least one ground layer, a second spacing is formed between at least partial region of the second protection structure and the via structure, and the second protection structure is electrically connected with the at least one power supply layer.

2. The semiconductor structure according to claim 1, wherein a length of the first protection structure and a length of the second protection structure are smaller than or equal to a length of the via structure in the preset direction.

3. The semiconductor structure according to claim 1, wherein the via structure is provided with a top end and a bottom end in the preset direction, the top end and the bottom end are opposite to each other, and the semiconductor structure further comprises:
a first bonding pad in contact with the top end and electrically connected with the top end; and
a second bonding pad in contact with the bottom end and electrically connected with the bottom end, wherein the first protection structure and the second protection structure are located between the first bonding pad and the second bonding pad, each of the first protection structure and the second protection structure is spaced apart from the first bonding pad, and each of the first protection structure and the second protection structure is spaced apart from the second bonding pad.

4. The semiconductor structure according to claim 3, wherein a plane where the bottom end is located is a projection plane, and a combination of an orthographic projection of the first protection structure on the projection plane and an orthographic projection of the second protection structure on the projection plane is located in an orthographic projection of the first bonding pad on the projection plane and is located in an orthographic projection of the second bonding pad on the projection plane.

5. The semiconductor structure according to claim 1, wherein in the direction surrounding the sidewall of the via structure, a ratio of an arc length of the first protection structure surrounding the sidewall of the via structure to a circumference of the sidewall of the via structure ranges from 0.4 to 0.6, and a ratio of an arc length of the second protection structure surrounding the sidewall of the via structure to the circumference of the sidewall of the via structure ranges from 0.4 to 0.6.

6. The semiconductor structure according to claim 1, wherein a ratio of a length of the first protection structure to a length of the via structure in the preset direction is not less than $3/4$.

7. The semiconductor structure according to claim 1, wherein a ratio of a length of the second protection structure to a length of the via structure in the preset direction is not less than $3/4$.

8. The semiconductor structure according to claim 1, wherein the first protection structure comprises at least two first sub-protection structures spaced apart from each other in the direction surrounding the sidewall of the via structure, at least one of the first sub-protection structures is electrically connected with the ground layer, the second protection structure comprises at least two second sub-protection structures spaced apart from each other in the direction surrounding the sidewall of the via structure, and at least one of the second sub-protection structures is electrically connected with the power supply layer.

9. The semiconductor structure according to claim 1, wherein the first protection structure comprises at least two first sub-protection structures spaced apart from each other in the preset direction, at least one of the first sub-protection structures is electrically connected with the ground layer, the second protection structure comprises at least two second sub-protection structures spaced apart from each other in the preset direction, and at least one of the second sub-protection structures is electrically connected with the power supply layer.

10. The semiconductor structure according to claim 8, wherein at least the other one of the first sub-protection structures is electrically connected with the power supply layer.

11. The semiconductor structure according to claim 8, wherein at least the other one of the second sub-protection structures is electrically connected with the ground layer.

12. The semiconductor structure according to claim 1, further comprising:
an anti-bonding pad region extending in the preset direction, wherein the via structure, the first protection structure, and the second protection structure are located within the anti-bonding pad region.

13. The semiconductor structure according to claim 12, wherein a ratio of a cross-sectional area of the anti-bonding pad region to a cross-sectional area of the via structure ranges from 9 to 12.25 in a plane perpendicular to the preset direction.

14. The semiconductor structure according to claim 12, wherein a third spacing is formed between the first protection structure and the anti-bonding pad region in a direction perpendicular to the preset direction, a fourth spacing is formed between the second protection structure and the anti-bonding pad region in the direction perpendicular to the preset direction, a ratio of a width of the first spacing to a width of the third spacing ranges from 0.8 to 4.5, and a ratio of a width of the second spacing to a width of the fourth spacing ranges from 0.8 to 4.5.

15. The semiconductor structure according to claim 14, wherein both a width of the first spacing and a width of the second spacing range from 150 um to 225 um.

16. The semiconductor structure according to claim 1, wherein each of a thickness of the first protection structure and a thickness of the second protection structure in a direction perpendicular to the preset direction ranges from 8 um to 25 um.

17. The semiconductor structure according to claim 1, wherein a material of the first protection structure is the same as a material of the ground layer, and a material of the second protection structure is the same as a material of the power supply layer.

18. The semiconductor structure according to claim 1, wherein each of a material of the first protection structure and a material of the second protection structure is one of conductive materials consisting of copper, silver and platinum.

19. The semiconductor structure according to claim 1, wherein the via structure is a hollow cylindrical structure.

20. The semiconductor structure according to claim 1, wherein the via structure is provided with a top end and a bottom end in the preset direction, the top end and the bottom end are opposite to each other, and the semiconductor structure further comprises:
a first wire layer, wherein the first wire layer is in contact with the top end, is electrically connected with the top end, and passes through a spacing between the first protection structure and the second protection structure; and
a second wire layer, wherein the second wire layer is in contact with the bottom end, is electrically connected with the bottom end, and passes through a spacing between the first protection structure and the second protection structure.

* * * * *